United States Patent
Shiomi

(10) Patent No.: US 11,233,125 B2
(45) Date of Patent: Jan. 25, 2022

(54) SILICON CARBIDE SEMICONDUCTOR DEVICE AND METHOD OF MANUFACTURING SILICON CARBIDE SEMICONDUCTOR DEVICE

(71) Applicant: Sumitomo Electric Industries, Ltd., Osaka (JP)

(72) Inventor: Hiromu Shiomi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/650,515

(22) PCT Filed: May 10, 2019

(86) PCT No.: PCT/JP2019/018738
§ 371 (c)(1),
(2) Date: Mar. 25, 2020

(87) PCT Pub. No.: WO2020/031446
PCT Pub. Date: Feb. 13, 2020

(65) Prior Publication Data
US 2020/0279921 A1 Sep. 3, 2020

(30) Foreign Application Priority Data

Aug. 9, 2018 (JP) .............................. JP2018-150518

(51) Int. Cl.
*H01L 21/336* (2006.01)
*H01L 29/161* (2006.01)
(Continued)

(52) U.S. Cl.
CPC .... *H01L 29/1608* (2013.01); *H01L 21/02378* (2013.01); *H01L 21/0465* (2013.01)

(58) Field of Classification Search
CPC .......... H01L 21/02378; H01L 21/0465; H01L 21/049; H01L 21/324; H01L 29/0623;
(Continued)

(56) References Cited

U.S. PATENT DOCUMENTS

2005/0161732 A1 7/2005 Mizukami et al.
2006/0011973 A1* 1/2006 Mizukami ........... H01L 29/8083
257/330

(Continued)

FOREIGN PATENT DOCUMENTS

JP 2005-236267 A 9/2005
JP 2014-192200 A 10/2014
(Continued)

*Primary Examiner* — Eric A. Ward
(74) *Attorney, Agent, or Firm* — Baker Botts L.L.P.; Michael A. Sartori

(57) ABSTRACT

A silicon carbide substrate includes a first impurity region having a first conductivity type, a second impurity region having a second conductivity type, a third impurity region having the first conductivity type, and a fourth impurity region provided between a second main surface and a bottom surface and having the second conductivity type. The first impurity region has a first region being in contact with the second impurity region and having a first impurity concentration, a second region being continuous to the first region, provided between the first region and the second main surface, and having a second impurity concentration lower than the first impurity concentration, and a third region being continuous to the first region and having a third impurity concentration higher than the first impurity concentration. A side surface is in contact with the third region, the second impurity region, and the third impurity region.

6 Claims, 19 Drawing Sheets

(51) Int. Cl.
*H01L 29/78* (2006.01)
*H01L 29/16* (2006.01)
*H01L 21/02* (2006.01)
*H01L 21/04* (2006.01)

(58) Field of Classification Search
CPC ............ H01L 29/0696; H01L 29/0878; H01L 29/1608; H01L 29/66068; H01L 29/66348; H01L 29/7397; H01L 29/7813
See application file for complete search history.

(56) References Cited

U.S. PATENT DOCUMENTS

| | | | |
|---|---|---|---|
| 2014/0295633 A1 | 10/2014 | Onogi | |
| 2015/0349115 A1 | 12/2015 | Tega et al. | |
| 2016/0247910 A1 | 8/2016 | Suzuki et al. | |
| 2017/0141223 A1* | 5/2017 | Hoshi | H01L 29/7813 |
| 2018/0040698 A1 | 2/2018 | Kobayashi et al. | |
| 2018/0083094 A1 | 3/2018 | Kyogoku et al. | |
| 2018/0182884 A1* | 6/2018 | Kobayashi | H01L 29/1608 |
| 2019/0123172 A1* | 4/2019 | De-Michielis | H01L 29/66348 |

FOREIGN PATENT DOCUMENTS

| | | |
|---|---|---|
| JP | 2015-072999 A | 4/2015 |
| JP | 2018-026562 A | 2/2018 |
| JP | 2018-049908 A | 3/2018 |
| WO | 2014/115253 A1 | 7/2014 |

* cited by examiner

SILICON CARBIDE SEMICONDUCTOR DEVICE AND METHOD OF MANUFACTURING SILICON CARBIDE SEMICONDUCTOR DEVICE

TECHNICAL FIELD

The present disclosure relates to a silicon carbide semiconductor device and a method of manufacturing a silicon carbide semiconductor device. The present application claims priority to Japanese Patent Application No. 2018-150518 filed on Aug. 9, 2018, the entire contents of which are incorporated herein by reference.

BACKGROUND ART

Japanese Patent Laying-Open No. 2015-072999 (PTL 1) describes a metal oxide semiconductor field effect transistor (MOSFET) having a trench gate structure. This MOSFET has a p type bottom layer formed to cover the bottom of a trench, and an n type current dispersion layer formed between a p type base region and an n type drift layer.

CITATION LIST

Patent Literature

PTL 1: Japanese Patent Laying-Open No. 2015-072999

SUMMARY OF INVENTION

A silicon carbide semiconductor device according to the present disclosure includes a silicon carbide substrate. The silicon carbide substrate has a first main surface and a second main surface opposite to the first main surface. The first main surface is provided with a trench having a side surface and a bottom surface continuous to the side surface. The silicon carbide substrate includes a first impurity region located between the first main surface and the second main surface and having a first conductivity type, a second impurity region located between the first main surface and the first impurity region, provided on the first impurity region, and having a second conductivity type different from the first conductivity type, a third impurity region located between the first main surface and the second impurity region, provided on the second impurity region so as to be separated from the first impurity region, and having the first conductivity type, and a fourth impurity region provided between the second main surface and the bottom surface and having the second conductivity type. The first impurity region has a first region being in contact with the second impurity region and having a first impurity concentration, a second region being continuous to the first region, provided between the first region and the second main surface, and having a second impurity concentration lower than the first impurity concentration, and a third region being continuous to the first region and having a third impurity concentration higher than the first impurity concentration. The side surface is in contact with the third region, the second impurity region, and the third impurity region.

A method of manufacturing a silicon carbide semiconductor device according to the present disclosure includes the following steps. A silicon carbide substrate having a first main surface and a second main surface opposite to the first main surface is prepared. The silicon carbide substrate includes a first impurity region located between the first main surface and the second main surface and having a first conductivity type, a second impurity region located between the first main surface and the first impurity region, provided on the first impurity region, and having a second conductivity type different from the first conductivity type, and a third impurity region located between the first main surface and the second impurity region, provided on the second impurity region so as to be separated from the first impurity region, being in contact with the first main surface, and having the first conductivity type. The first impurity region has a first region in contact with the second impurity region, and a second region being continuous to the first region and located opposite to the second impurity region with respect to the first region. A mask is further formed on the first main surface. The third impurity region and the second impurity region are etched using the mask, to form a first trench in the first main surface. Ions are implanted into the first trench using the mask, to form a fourth impurity region being in contact with the first impurity region and having the second conductivity type. Ions are implanted into the first trench using the mask, to form a third region being in contact with the first impurity region and having the first conductivity type. The third region, the second impurity region and the fourth impurity region are etched using the mask, to extend the first trench to form a second trench. A side surface of the second trench is in contact with the third region, the second impurity region, and the third impurity region.

A method of manufacturing a silicon carbide semiconductor device according to the present disclosure includes the following steps. A silicon carbide substrate having a first main surface and a second main surface opposite to the first main surface is prepared. The silicon carbide substrate includes a first impurity region located between the first main surface and the second main surface and having a first conductivity type, a second impurity region located between the first main surface and the first impurity region, provided on the first impurity region, and having a second conductivity type different from the first conductivity type, and a third impurity region located between the first main surface and the second impurity region, provided on the second impurity region so as to be separated from the first impurity region, being in contact with the first main surface, and having the first conductivity type. The first impurity region has a first region in contact with the second impurity region, and a second region being continuous to the first region and located opposite to the second impurity region with respect to the first region. A mask is further formed on the first main surface. The third impurity region and the second impurity region are etched using the mask, to form a first trench in the first main surface. Ions are implanted into the first trench using the mask, to form a third region being in contact with the first impurity region and having the first conductivity type. The third region and the second impurity region are etched using the mask, to extend the first trench to form a second trench. Ions are implanted into the second trench using the mask, to form a fourth impurity region being in contact with the first impurity region and having the second conductivity type. A side surface of the second trench is in contact with the third region, the second impurity region, and the third impurity region.

DETAILED DESCRIPTION

Figure 1:
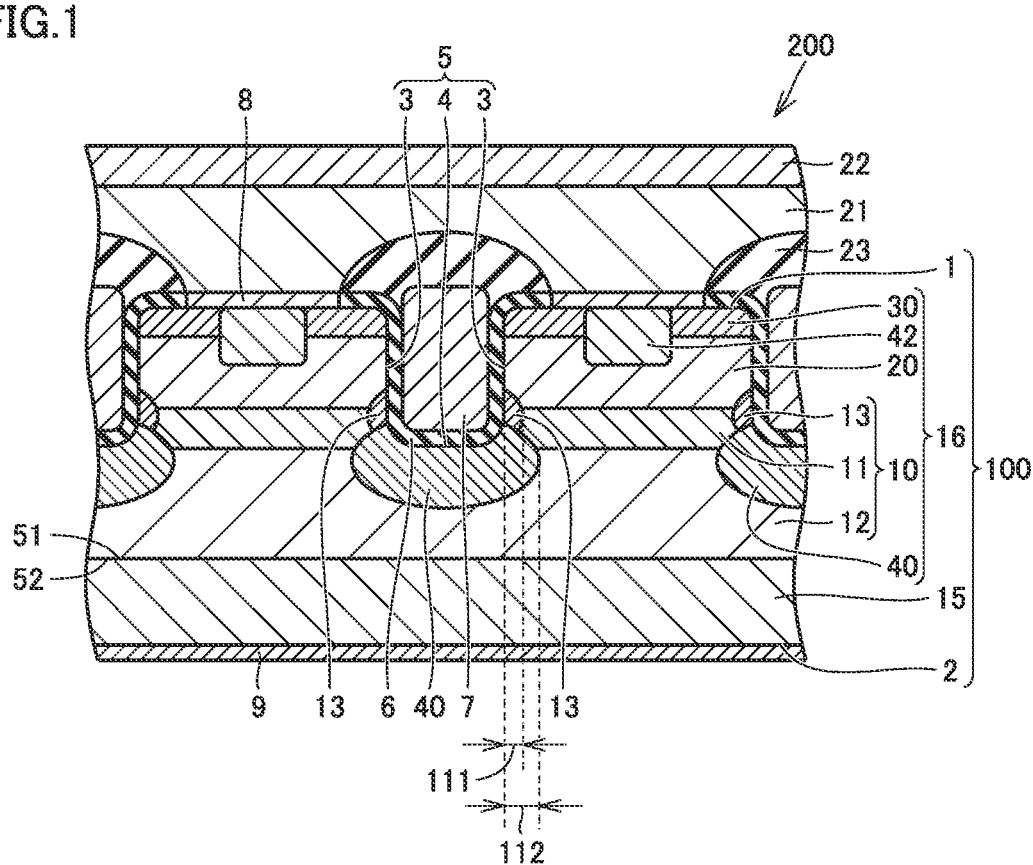
FIG. 1 is a schematic cross-sectional view showing the structure of a silicon carbide semiconductor device according to a first embodiment.

Problem to be Solved by the Present Disclosure

An object of the present disclosure is to provide a silicon carbide semiconductor device capable of reducing a characteristic on resistance while maintaining a high breakdown voltage, and a method of manufacturing a silicon carbide semiconductor device.

Advantageous Effect of the Present Disclosure

According to the present disclosure, a silicon carbide semiconductor device capable of reducing a characteristic on resistance while maintaining a high breakdown voltage, and a method of manufacturing a silicon carbide semiconductor device can be provided.

Summary of Embodiments of the Present Disclosure

An overview of embodiments of the present disclosure is initially provided. Regarding crystallographic denotation herein, an individual orientation, a group orientation, an individual plane, and a group plane are shown in [ ], < >, ( ) and { }, respectively. A crystallographically negative index is normally expressed by a number with a bar "-" thereabove, however, a negative sign herein precedes a number to express a crystallographically negative index.

(1) A silicon carbide semiconductor device 200 according to the present disclosure includes a silicon carbide substrate 100. Silicon carbide substrate 100 has a first main surface 1 and a second main surface 2 opposite to first main surface 1. First main surface 1 is provided with a trench 5 having a side surface 3 and a bottom surface 4 continuous to side surface 3. Silicon carbide substrate 100 includes a first impurity region 10 located between first main surface 1 and second main surface 2 and having a first conductivity type, a second impurity region 20 located between first main surface 1 and first impurity region 10, provided on first impurity region 10, and having a second conductivity type different from the first conductivity type, a third impurity region 30 located between first main surface 1 and second impurity region 20, provided on second impurity region 20 so as to be separated from first impurity region 10, and having the first conductivity type, and a fourth impurity region 40 provided between second main surface 2 and bottom surface 4 and having the second conductivity type. First impurity region 10 has a first region 11 being in contact with second impurity region 20 and having a first impurity concentration, a second region 12 being continuous to first region 11, provided between first region 11 and second main surface 2, and having a second impurity concentration lower than the first impurity concentration, and a third region 13 being continuous to first region 11 and having a third impurity concentration higher than the first impurity concentration. Side surface 3 is in contact with third region 13, second impurity region 20, and third impurity region 30.

(2) In silicon carbide semiconductor device 200 according to (1), fourth impurity region 40 may be in contact with bottom surface 4.

(3) According to silicon carbide semiconductor device 200 according to (2), in a direction parallel to first main surface 1, a distance from side surface 3 to an end of third region 13 may be shorter than a distance from side surface 3 to an end of fourth impurity region 40.

(4) In silicon carbide semiconductor device 200 according to (1), fourth impurity region 40 may be spaced apart from bottom surface 4. Third region 13 may be provided between bottom surface 4 and fourth impurity region 40, and be in contact with each of bottom surface 4 and fourth impurity region 40.

(5) In silicon carbide semiconductor device 200 according to (4), third region 13 may be in contact with second region 12. In a direction parallel to first main surface 1, a distance from side surface 3 to an end of third region 13 may be shorter than a distance from side surface 3 to an end of fourth impurity region 40.

(6) A method of manufacturing a silicon carbide semiconductor device 200 according to the present disclosure includes the following steps. A silicon carbide substrate 100 having a first main surface 1 and a second main surface 2 opposite to first main surface 1 is prepared. Silicon carbide substrate 100 includes a first impurity region 10 located between first main surface 1 and second main surface 2 and having a first conductivity type, a second impurity region 20 located between first main surface 1 and first impurity region 10, provided on first impurity region 10, and having a second conductivity type different from the first conductivity type, and a third impurity region 30 located between first main surface 1 and second impurity region 20, provided on second impurity region 20 so as to be separated from first impurity region 10, being in contact with first main surface 1, and having the first conductivity type. First impurity region 10 has a first region 11 in contact with second impurity region 20, and a second region 12 being continuous to first region 11 and located opposite to second impurity region 20 with respect to first region 11. A mask 64 is further formed on first main surface 1. Third impurity region 30 and second impurity region 20 are etched using mask 64, to form a first trench 70 in first main surface 1. Ions are implanted into first trench 70 using mask 64, to form a fourth impurity region 40 being in contact with first impurity region 10 and having the second conductivity type. Ions are implanted into first trench 70 using mask 64, to form a third region 13 being in contact with first impurity region 10 and having the first conductivity type. Third region 13, second impurity region 20 and fourth impurity region 40 are etched using mask 64, to extend first trench 70 to form a second trench 5. A side surface 3 of second trench 5 is in contact with third region 13, second impurity region 20, and third impurity region 30.

(7) A method of manufacturing a silicon carbide semiconductor device 200 according to the present disclosure includes the following steps. A silicon carbide substrate 100 having a first main surface 1 and a second main surface 2 opposite to first main surface 1 is prepared. Silicon carbide substrate 100 includes a first impurity region 10 located between first main surface 1 and second main surface 2 and having a first conductivity type, a second impurity region 20 located between first main surface 1 and first impurity region 10, provided on first impurity region 10, and having a second conductivity type different from the first conductivity type, and a third impurity region 30 located between first main surface 1 and second impurity region 20, provided on second impurity region 20 so as to be separated from first impurity region 10, being in contact with first main surface 1, and having the first conductivity type. First impurity region 10 has a first region 11 in contact with second impurity region 20, and a second region 12 being continuous to first region 11 and located opposite to second impurity region 20 with respect to first region 11. A mask 64 is further formed on first main surface 1. Third impurity region 30 and second impurity region 20 are etched using mask 64, to form a first trench 70 in first main surface 1. Ions are implanted into first trench 70 using mask 64, to form a third region 13 being in contact with first impurity region 10 and having the first conductivity type. Third region 13 and second impurity region 20 are etched using mask 64, to extend first trench 70 to form a second trench 5. Ions are implanted into second trench 5 using mask 64, to form a fourth impurity region 40 being in contact with first impurity region 10 and having the second conductivity type. A side surface 3 of second trench 5 is in contact with third region 13, second impurity region 20, and third impurity region 30.

(8) In the method of manufacturing silicon carbide semiconductor device 200 according to (6) or (7), after forming second trench 5, silicon carbide substrate 100 may be annealed at not less than 1400° C. and not more than 1900° C. in a silicon carbide atmosphere.

DETAILS OF EMBODIMENTS OF THE PRESENT DISCLOSURE

The details of the embodiments of the present disclosure are hereinafter described. The same or corresponding elements in the description below are designated by the same symbols and the same description thereof will not be repeated.

First Embodiment

The configuration of a MOSFET as a silicon carbide semiconductor device according to a first embodiment is initially described.

As shown in FIG. 1, a silicon carbide semiconductor device 200 according to the present embodiment mainly includes a silicon carbide substrate 100, a gate electrode 7, a gate insulating film 6, an interlayer insulating film 23, a source electrode 8, a source wire 21, a drain electrode 9, and a protective film 22. Silicon carbide substrate 10 has a first main surface 1, and a second main surface 2 opposite to first main surface 1. Silicon carbide substrate 100 includes a silicon carbide single-crystal substrate 15, and a silicon carbide epitaxial layer 16 provided on silicon carbide single-crystal substrate 15. Silicon carbide single-crystal substrate 15 defines second main surface 2 of silicon carbide substrate 100. Silicon carbide epitaxial layer 16 defines first main surface 1 of silicon carbide substrate 100.

Silicon carbide single-crystal substrate 15 is made of hexagonal silicon carbide having a polytype of 4H, for example. A maximum diameter of first main surface 1 of silicon carbide substrate 100 is 150 mm, for example, and preferably not less than 150 mm. First main surface 1 is a {0001} plane or a plane angled off by not more than 8° relative to the {0001} plane, for example. Specifically, first main surface 1 is a (0001) plane or a plane angled off by not more than 8° relative to the (0001) plane, for example. First main surface 1 may be a (000-1) plane or a plane angled off by not more than 8° relative to the (000-1) plane, for example. Silicon carbide single-crystal substrate 15 has a thickness of 400 μm, for example. Silicon carbide single-crystal substrate 15 has a resistivity of 0.017 Ωcm, for example.

Silicon carbide epitaxial layer 16 mainly includes a first impurity region 10, a base region 20 (second impurity region 20), a source region 30 (third impurity region 30), a contact region 42, and a fourth impurity region 40. First impurity region 10 is an n type (first conductivity type) region including an n type impurity (donor) for providing n type such as nitrogen. First impurity region 10 is located between first main surface 1 and second main surface 2.

First impurity region 10 mainly includes a first region 11, a second region 12, and a third region 13. First region 11 is a current spread layer. First region 11 is in contact with second impurity region 20. First region 11 has a first impurity concentration. A concentration of the n type impurity contained in first region 11 (first impurity concentration) is not less than $3 \times 10^{16}$ cm$^{-3}$ and not more than $3 \times 10^{17}$ cm$^{-3}$, for example. First region 11 has a thickness of not less than 0.2 μm and not more than 0.5 μm, for example.

Second region 12 is a drift layer. Second region 12 is provided between first region 11 and second main surface 2. Second region 12 is continuous to first region 11. Second region 12 has a second impurity concentration lower than the first impurity concentration. A concentration of the n type impurity contained in second region 12 (second impurity concentration) is $8 \times 10^{15}$ cm$^3$, for example. Second region 12 may be greater in thickness than first region 11.

Third region 13 is a local current spread region. Third region 13 is continuous to first region 11. Third region 13 has a third impurity concentration higher than the first impurity concentration. A concentration of the n type impurity contained in third region 13 (third impurity concentration) is not less than $2 \times 10^{16}$ cm$^{-3}$ and not more than $5 \times 10^{17}$ cm$^{-3}$, for example. The concentration of the n type impurity contained in second region 12 (second impurity concentration) is lower than a concentration of an n type impurity contained in the silicon carbide single-crystal substrate. When the concentration of the n type impurity contained in first region 11 is set too high, punch-through (reach-through) tends to occur. By setting a high concentration of the n type impurity contained in third region 13 while keeping a low concentration of the n type impurity contained in first region 11, the spread of a current in the vicinity of a channel outlet can be ensured while the punch-through is suppressed. Thus, an on resistance of silicon carbide semiconductor device 200 can be reduced.

Base region 20 is in contact with first impurity region 10. Base region 20 is located between first main surface 1 and first impurity region 10. Base region 20 is provided on first impurity region 10. Base region 20 has p type (second conductivity type) different from the n type. Base region 20 contains a p type impurity (acceptor) for providing p type such as Al (aluminum) or B (boron). A concentration of the p type impurity contained in base region 20 is not less than $1 \times 10^{17}$ cm$^{-3}$ and not more than $2 \times 10^{18}$ cm$^3$, for example. Base region 20 has a thickness of not less than 0.2 and not more than 0.5 μm, for example.

Source region 30 is provided on base region 20 so as to be separated from first impurity region 10 by base region 20. Source region 30 is located between first main surface 1 and base region 20. Source region 30 contains an n type impurity for providing n type such as phosphorus, and has n type. A concentration of the n type impurity contained in source region 30 is higher than the concentration of the n type impurity contained in second region 12. The concentration of the n type impurity such as phosphorus contained in source region 30 is not less than $2 \times 10^{18}$ cm$^{-3}$ and not more than $1 \times 10^{19}$ cm$^{-3}$, for example. Source region 30 has a thickness of not less than 0.1 μm and not more than 0.2 μm, for example.

Contact region 42 is a p type region containing a p type impurity such as aluminum or boron. Contact region 42 is in contact with each of source region 30 and base region 20. A concentration of the p type impurity contained in contact region 42 is higher than the concentration of the p type impurity contained in base region 20. The concentration of the p type impurity such as aluminum contained in contact region 42 is not less than $2 \times 10^{18}$ cm$^{-3}$ and not more than $1 \times 10^{19}$ cm$^{-3}$, for example. Contact region 42 has a thickness of not less than 0.1 μm and not more than 1.3 μm, for example.

First main surface 1 of silicon carbide substrate 100 is provided with a trench 5 (gate trench). Trench 5 has a side surface 3 and a bottom surface 4. Bottom surface 4 is continuous to side surface 3. Side surface 3 extends in a direction substantially perpendicular to first main surface 1. Bottom surface 4 is substantially in parallel to first main surface 1. A boundary between side surface 3 and bottom surface 4 may be formed to have a curvature. Trench 5 has a depth of not less than 0.5 μm and not more than 1.5 μm, for example. Trench 5 has a width of not less than 0.6 μm and not more than 2.5 μm, for example.

Fourth impurity region 40 is provided between second main surface 2 and bottom surface 4 of trench 5. Fourth impurity region 40 may be in contact with bottom surface 4, as shown in FIG. 1. Fourth impurity region 40 contains a p type impurity such as aluminum or boron, and has p type (second conductivity type).

Fourth impurity region 40 is higher in impurity concentration than base region 20. Fourth impurity region 40 may be electrically connected to source electrode 8. A concentration of the p type impurity such as aluminum contained in fourth impurity region 40 is not less than $1 \times 10^{18}$ cm$^{-3}$ and not more than $9 \times 10^{18}$ cm$^{-3}$, for example.

As shown in FIG. 1, side surface 3 of trench 5 is in contact with third region 13, second impurity region 20, third impurity region 30, and fourth impurity region 40. First region 11 is spaced apart from side surface 3. Second region 12 is spaced apart from side surface 3. Third region 13 is in contact with each of first region 11 and second impurity region 20. Third region 13 may be in contact with a boundary between first region 11 and second impurity region 20. Third region 13 is in contact with side surface 3, and protrudes in a direction away from side surface 3. First region 11 is in contact with second region 12. Second region 12 is electrically connected to third region 13, but may be physically spaced apart from third region 13.

Figure 2:
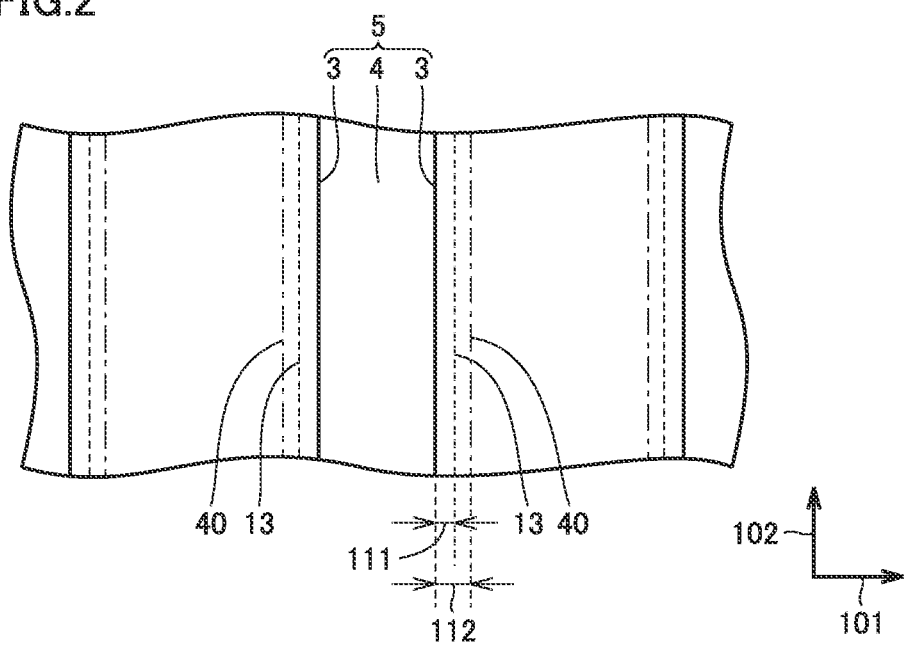
FIG. 2 is a schematic plan view showing the structure of a trench in the silicon carbide semiconductor device according to the first embodiment.

Bottom surface 4 of trench 5 is in contact with fourth impurity region 40, for example. Fourth impurity region 40 is provided to face the entire bottom surface 4, for example. As shown in FIG. 2, in a direction parallel to first main surface 1, fourth impurity region 40 may be greater in width than bottom surface 4. In the direction parallel to first main surface 1, a distance from side surface 3 to an end of third region 13 (first distance 111) is shorter than a distance from side surface 3 to an end of fourth impurity region 40 (second distance 112). Stated from another perspective, in the direction parallel to first main surface 1, an amount of spread of fourth impurity region 40 from side surface 3 is larger than an amount of spread of third region 13 from side surface 3.

The end of third region 13 refers to a position that has a concentration of 1/e of a maximum value of the concentration of the n type impurity in third region 13, and that is farthest from side surface 3 in the direction parallel to first main surface 1. It should be noted that "e" represents a Napier's constant. The end of fourth impurity region 40 refers to a position where a carrier concentration exhibits a minimal value due to cancellation of the n type impurity in adjacent first impurity region 10 and the p type impurity in fourth impurity region 40, and that is farthest from side surface 3 in the direction parallel to first main surface 1.

As shown in FIG. 2, as seen in a direction perpendicular to second main surface 2, trench 5 may have a substantially rectangular shape. Trench 5 extends in a first direction 101 and a second direction 102. First direction 101 is a short direction of trench 5. Second direction 102 is a longitudinal direction of trench 5. First direction 101 is a <1-100> direction, for example. Second direction 102 is a <11-20> direction, for example. First direction 101 may be a direction defined by projecting the <1-100> direction on first main surface 1, for example. Second direction 102 may be a direction defined by projecting the <11-20> direction on first main surface 1, for example.

As shown in FIG. 2, each of third region 13 and fourth impurity region 40 extends in a direction in which trench 5 extends. A longitudinal direction of third region 13 is the same as the longitudinal direction of trench 5. A short direction of third region 13 is the same as the short direction of trench 5. A longitudinal direction of fourth impurity region 40 is the same as the longitudinal direction of trench 5. A short direction of fourth impurity region 40 is the same as the short direction of trench 5. As shown in FIG. 2, as seen in the direction perpendicular to second main surface 2, fourth impurity region 40 is superimposed on bottom surface 4 of trench 5. In the short direction of trench 5, fourth impurity region 40 may be greater in width than trench 5. Likewise, in the longitudinal direction of trench 5, fourth impurity region 40 may be greater in width than trench 5.

Gate insulating film 6 is made of silicon dioxide, for example. Gate insulating film 6 is provided to be in contact with side surface 3 and bottom surface 4 of trench 5. Gate insulating film 6 is in contact with third region 13, base region 20, source region 30, and fourth impurity region 40, at side surface 3 of trench 5. Gate insulating film 6 is in contact with fourth impurity region 40 at bottom surface 4 of trench 5. The configuration is such that a channel region can be formed in base region 20 in contact with gate insulating film 6. Gate insulating film 6 has a thickness of not less than 40 nm and not more than 150 nm, for example.

Gate electrode 7 is provided on gate insulating film 6. Gate electrode 7 is disposed in contact with gate insulating film 6. The gate electrode is provided to fill a groove formed by gate insulating film 6. Gate electrode 7 is made of a conductor such as polysilicon doped with an impurity, for example.

Source electrode 8 is made of a Ni alloy, for example. Source electrode 8 is electrically connected to source region 30 on the first main surface 1 side of silicon carbide substrate 100. Source electrode 8 is in contact with contact region 42. Source electrode 8 includes an alloy layer in ohmic contact with source region 30. The alloy layer is a silicide with a metal contained in source electrode 8, for example. Source electrode 8 may be made of a material containing Ti, Al and Si.

Interlayer insulating film 23 is provided at a position facing first main surface 1 of silicon carbide substrate 100. Specifically, interlayer insulating film 23 is provided in contact with each of gate electrode 7 and gate insulating film 6 so as to cover gate electrode 7. Interlayer insulating film 23 includes a none-doped silicate glass (NSG) film and a phosphorus silicate glass (PSG) film, for example. The NSG may be provided on the PSG. Interlayer insulating film 23 electrically insulates gate electrode 7 and source electrode 8 from each other. Source wire 21 is provided to cover interlayer insulating film 23 and to be in contact with source electrode 8. Source wire 21 is electrically connected to source region 30 via source electrode 8. Source wire 21 is made of a material containing AlSiCu, for example. Protective film 22 is provided on source wire 21 to cover source wire 21. Protective film 22 includes a nitride film and polyimide, for example.

Drain electrode 9 is provided in contact with second main surface 2 of silicon carbide substrate 100. Drain electrode 9 is electrically connected to first impurity region 10 on the second main surface 2 side. Drain electrode 9 is made of a material, such as NiSi (nickel silicide), capable of making ohmic contact with silicon carbide single-crystal substrate 15 of n type. Drain electrode 9 is electrically connected to silicon carbide single-crystal substrate 15.

Operation of MOSFET 200 according to the present embodiment is now described. When a voltage applied to gate electrode 7 is lower than a threshold voltage, that is, in an off state, a pn junction formed between base region 20 and first impurity region 10 is reverse biased and is non-conducting even if a voltage is applied between source electrode 8 and drain electrode 9. When a voltage equal to or higher than the threshold voltage is applied to gate electrode 7, on the other hand, an inversion layer is formed in a channel region near an area where base region 20 and gate insulating film 6 are in contact with each other. As a result, source region 30 and first impurity region 10 are electrically connected to each other, causing a current to flow between source electrode 8 and drain electrode 9. MOSFET 200 operates in a manner described above.

Figure 3:
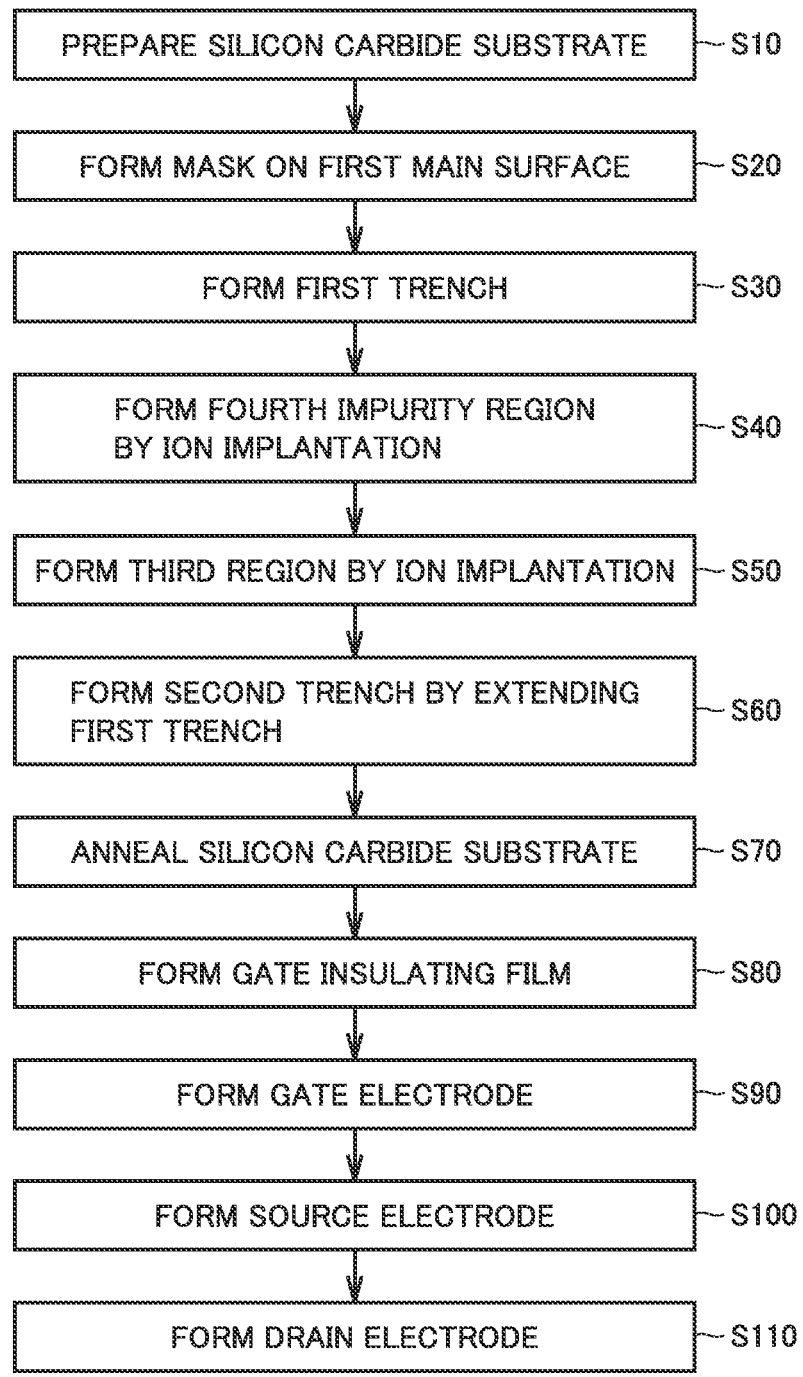
FIG. 3 is a flow diagram schematically showing a method of manufacturing the silicon carbide semiconductor device according to the first embodiment.

A method of manufacturing silicon carbide semiconductor device 200 according to the present embodiment is now described. FIG. 3 is a flowchart schematically showing the method of manufacturing the silicon carbide semiconductor device according to the present embodiment.

Figure 4:
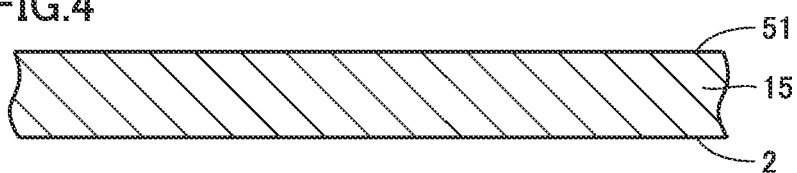
FIG. 4 is a schematic cross-sectional view showing a first step of the method of manufacturing the silicon carbide semiconductor device according to the first embodiment.

First, a step of preparing a silicon carbide substrate (FIG. 3: S10) is performed. For example, a silicon carbide single-crystal ingot grown with a modified Lely method is sliced to cut a substrate, and a surface of the substrate is mirror polished, to prepare silicon carbide single-crystal substrate 15 (see FIG. 4). Silicon carbide single-crystal substrate 15 is made of hexagonal silicon carbide having a polytype of 4H, for example. Silicon carbide single-crystal substrate 15 has a third main surface 51, and second main surface 2 opposite to third main surface 51. Third main surface 51 has a diameter of 150 mm, for example. Third main surface 51 is a {0001} plane or a plane angled off by not more than about 8° relative to the {0001} plane, for example. Silicon carbide single-crystal substrate 15 has a thickness of 400 μm, for example.

Figure 5:
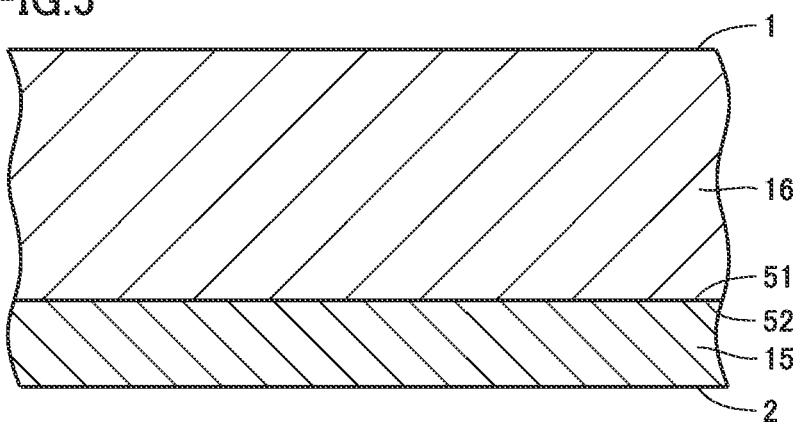
FIG. 5 is a schematic cross-sectional view showing a second step of the method of manufacturing the silicon carbide semiconductor device according to the first embodiment.
Figure 6:
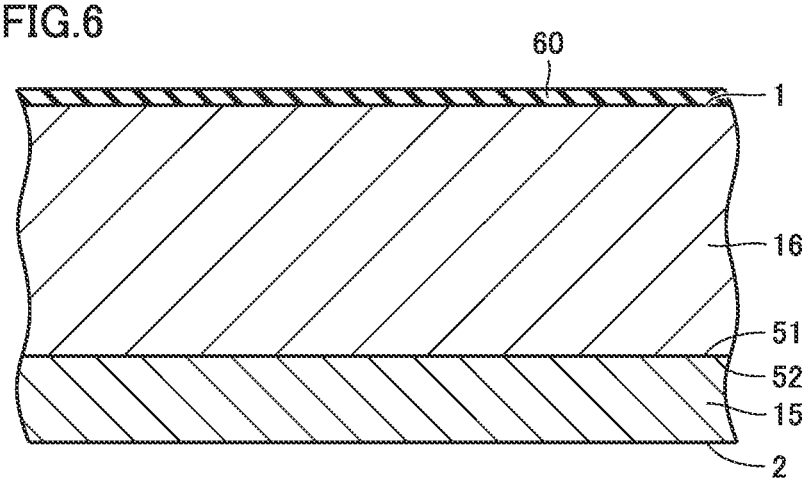
FIG. 6 is a schematic cross-sectional view showing a third step of the method of manufacturing the silicon carbide semiconductor device according to the first embodiment.

Then, a step of forming a silicon carbide epitaxial layer is performed. For example, carrier gas containing hydrogen, source material gas containing silane and propane, and dopant gas containing nitrogen are supplied onto silicon carbide single-crystal substrate 15, and silicon carbide single-crystal substrate 15 is heated to about 1550° C., for example, under a pressure of 100 mbar (10 kPa). Silicon carbide epitaxial layer 16 having n type is thus formed on silicon carbide single-crystal substrate 15, as shown in FIG. 5. Silicon carbide epitaxial layer 16 has been doped with nitrogen as an n type impurity. A concentration of the n type impurity is $8.0 \times 10^{15}$ $cm^3$, for example. Silicon carbide epitaxial layer 16 has a thickness of 10 μm, for example.

Next, an ion implantation through-mask 60 is formed. Ion implantation through-mask 60 is formed by a combination of a thermal oxide film and a deposited oxide film, for example. Ion implantation through-mask 60 has a thickness of about 50 nm, for example. Then, ions are implanted into silicon carbide epitaxial layer 16. N (nitrogen) ions, for example, are implanted through ion implantation through-mask 60 into silicon carbide epitaxial layer 16 in a direction of arrows (direction perpendicular to third main surface 51). First region 11 having n type is thus formed. A concentration of the n type impurity contained in first region 11 is not less than $3 \times 10^{16}$ $cm^{-3}$ and not more than $3 \times 10^{17}$ $cm^{-3}$, for example. First region 11 has a thickness of not less than 0.2 μm and not more than 0.5 μm, for example.

Then, Al (aluminum) ions, for example, are implanted through ion implantation through-mask 60 into a part of first region 11 of silicon carbide epitaxial layer 16 in the direction of arrows. Second impurity region 20 having p type is thus formed. A concentration of the p type impurity contained in second impurity region 20 is not less than $1 \times 10^{17}$ cm$^{-3}$ and not more than $2 \times 10^{18}$ cm$^{-3}$, for example. Second impurity region 20 has a thickness of not less than 0.2 μm and not more than 0.5 μm, for example.

Figure 7:
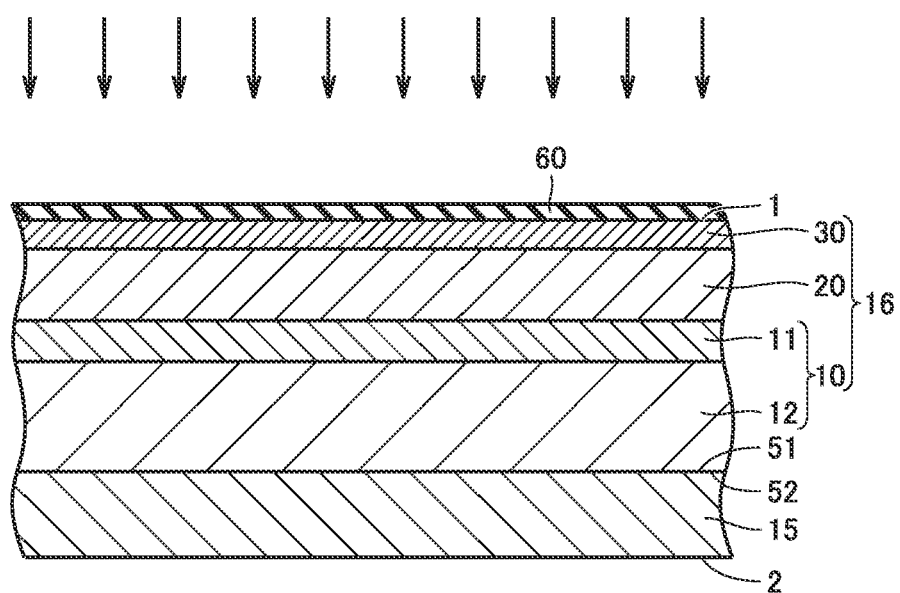
FIG. 7 is a schematic cross-sectional view showing a fourth step of the method of manufacturing the silicon carbide semiconductor device according to the first embodiment.

Then, P (phosphorus) ions, for example, are implanted through ion implantation through-mask 60 into a part of second impurity region 20 of silicon carbide epitaxial layer 16 in the direction of arrows. Third impurity region 30 having n type is thus formed (see FIG. 7). A concentration of the n type impurity contained in third impurity region 30 is not less than $2 \times 10^{18}$ cm$^{-3}$ and not more than $1 \times 10^{19}$ cm$^3$, for example. Third impurity region 30 has a thickness of not less than 0.1 μm and not more than 0.2 μm, for example.

Figure 8:
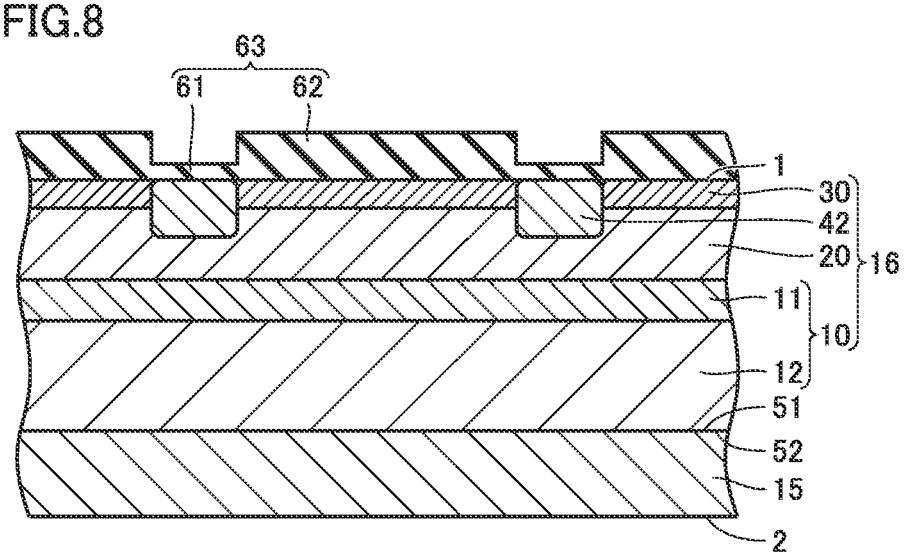
FIG. 8 is a schematic cross-sectional view showing a fifth step of the method of manufacturing the silicon carbide semiconductor device according to the first embodiment.

Then, an oxide film mask 63 is formed. Oxide film mask 63 has a first portion 61 and a second portion 62. Second portion 62 is greater in thickness than first portion 61. Al (aluminum) ions, for example, are implanted through oxide film mask 63 into a part of second impurity region 20 and a part of third impurity region 30 of silicon carbide epitaxial layer 16. Contact region 42 having p type is thus formed (see FIG. 8). A concentration of the p type impurity contained in contact region 42 is not less than $2 \times 10^{18}$ cm$^3$ and not more than $1 \times 10^{19}$ cm$^{-3}$, for example. Contact region 42 has a thickness of not less than 0.1 μm and not more than 0.3 μm, for example. Contact region 42 extends through third impurity region 30 and reaches second impurity region 20.

Silicon carbide substrate 100 having first main surface 1 and second main surface 2 opposite to first main surface 1 is prepared as set forth above. Silicon carbide substrate 100 includes first impurity region 10 having the first conductivity type, second impurity region 20 provided on first impurity region 10 and having the second conductivity type different from the first conductivity type, and third impurity region 30 provided on second impurity region 20 so as to be separated from first impurity region 10, being in contact with second main surface 2, and having the first conductivity type. First impurity region 10 has first region 11 in contact with second impurity region 20, and second region 12 located opposite to second impurity region 20 with respect to first region 11.

Next, a step of forming a mask on a first main surface (S20: FIG. 3) is performed. Specifically, a mask 64 is formed on first main surface 1. Mask 64 functions as an etching mask. Mask 64 is made of a material including a deposited oxide film, for example. Mask 64 has a thickness of 1.6 μm, for example. Then, mask 64 over a region where a first trench 70 is to be formed is RF etched using CHF$_3$ and O$_2$, to form an opening in mask 64.

Next, a step of forming a first trench (S30: FIG. 3) is performed. Silicon carbide substrate 100 is etched using mask 64 having the opening formed over the region where first trench 70 is to be formed. For example, using mask 64, third impurity region 30 and second impurity region 20 are anisotropically etched under an atmosphere of SF$_6$ and O$_2$. The anisotropic etching refers to electron cyclotron resonance (ECR) plasma etching, for example. First trench 70 is thus formed in first main surface 1 of silicon carbide substrate 100.

Figure 9:
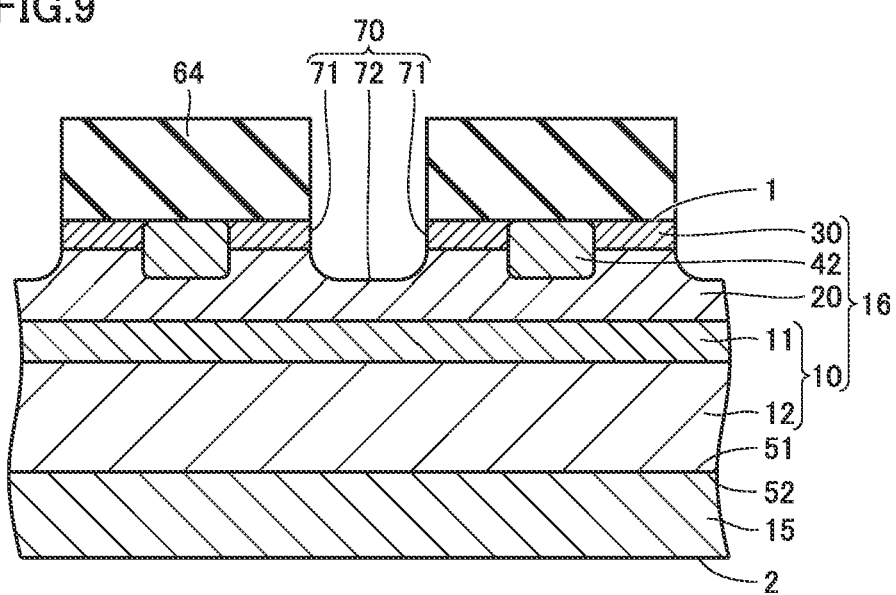
FIG. 9 is a schematic cross-sectional view showing a sixth step of the method of manufacturing the silicon carbide semiconductor device according to the first embodiment.

As shown in FIG. 9, first trench 70 has a first side surface 71 and a first bottom surface 72. First side surface 71 is in contact with second impurity region 20 and third impurity region 30. First bottom surface 72 is in contact with second impurity region 20. First trench 70 has a depth of not less than 0.3 μm and not more than 0.8 μm, for example. First trench 70 has a width of not less than 0.5 μm and not more than 2 μm, for example.

Next, a step of forming a fourth impurity region by ion implantation (S40: FIG. 3) is performed. Specifically, ions are implanted into first trench 70 using mask 64. In this step, mask 64 functions as an ion implantation mask. Specifically, Al (aluminum) ions are implanted into a part of first region 11 and a part of second region 12, with mask 64 being provided on first main surface 1. Ion implantation energy is not less than 700 keV, for example. Fourth impurity region 40 having p type is thus formed.

Fourth impurity region 40 is in contact with first impurity region 10. Specifically, fourth impurity region 40 is in contact with each of first region 11 and second region 12. In the direction parallel to first main surface 1, fourth impurity region 40 is greater in width than first bottom surface 72 of first trench 70. Fourth impurity region 40 spreads about 0.2 μm from each of paired first side surfaces 71 of first trench 70. A concentration of the p type impurity contained in fourth impurity region 40 is not less than $1 \times 10^{18}$ cm$^{-3}$ and not more than $9 \times 10^{18}$ cm$^{-3}$, for example. Fourth impurity region 40 has a thickness of not less than 0.5 μm and not more than 1.5 μm, for example.

Next, a step of forming a third region by ion implantation (S50: FIG. 3) is performed. Specifically, N (nitrogen) ions are implanted into a part of first region 11, a part of second impurity region 20, and a part of fourth impurity region 40, with mask 64 being provided on first main surface 1. Ion implantation energy is not less than 400 keV, for example. Third region 13 having n type is thus formed. The ion implantation energy in the step of forming a third region by ion implantation (S50: FIG. 3) is smaller than the ion implantation energy in the step of forming a fourth impurity region by ion implantation (S40: FIG. 3). Third region 13 is formed on the first main surface 1 side with respect to fourth impurity region 40.

Figure 10:
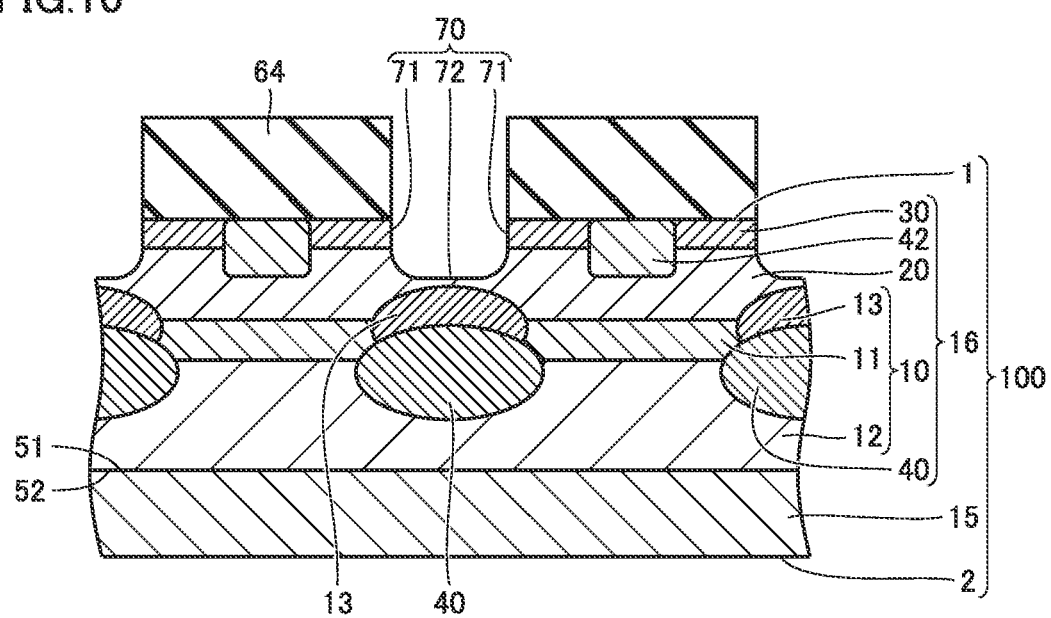
FIG. 10 is a schematic cross-sectional view showing a seventh step of the method of manufacturing the silicon carbide semiconductor device according to the first embodiment.

As shown in FIG. 10, third region 13 is in contact with first impurity region 10. Specifically, third region 13 is in contact with each of first region 11, second impurity region 20 and fourth impurity region 40. In the direction parallel to first main surface 1, third region 13 is greater in width than first bottom surface 72 of first trench 70, and is smaller in width than fourth impurity region 40. Third region 13 spreads about 0.1 μm from each of paired first side surfaces 71 of first trench 70. Third region 13 is higher in impurity concentration than first region 11. A concentration of the n type impurity contained in third region 13 is not less than $2 \times 10^{16}$ cm$^{-3}$ and not more than $5 \times 10^{17}$ cm$^{-3}$, for example. Third region 13 has a thickness of not less than 0.3 μm and not more than 1 for example. Third region 13 may be formed to be spaced apart from first bottom surface 72 of first trench 70. In this case, second impurity region 20 is provided between third region 13 and first bottom surface 72.

When using silicon carbide substrate 100 having first main surface 1 inclined relative to a {0001} plane (off substrate), channeling can be suppressed. Thus, ion implantation can be effectively performed in a direction perpendicular to first main surface 1. When ion implantation is performed in a direction inclined relative to the normal of first main surface 1, lateral spread can be facilitated.

Next, a step of forming a second trench by extending the first trench (S60: FIG. 3) is performed. Specifically, using mask 64, third region 13, second impurity region 20 and fourth impurity region 40 are ECR plasma etched under an atmosphere of $SF_6$ and $O_2$. First trench 70 is thus extended to form a second trench 5. First trench 70 is extended mainly in a depth direction.

Figure 11:
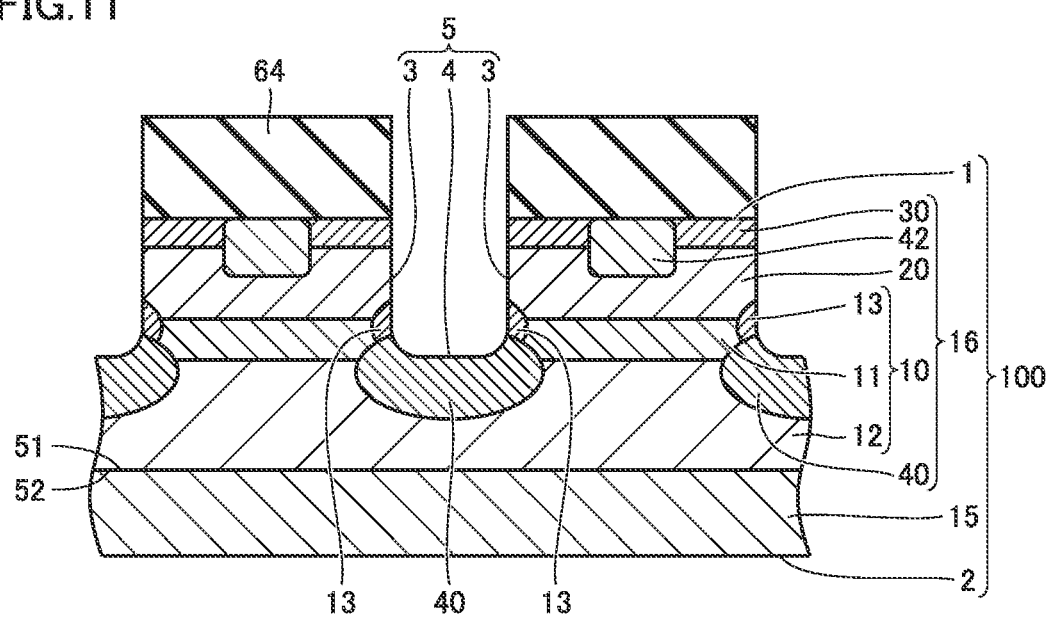
FIG. 11 is a schematic cross-sectional view showing an eighth step of the method of manufacturing the silicon carbide semiconductor device according to the first embodiment.

As shown in FIG. 11, second trench 5 has a second side surface 3 and a second bottom surface 4. Second side surface 3 is in contact with third region 13, second impurity region 20, third impurity region 30, and fourth impurity region 40. Second bottom surface 4 is in contact with fourth impurity region 40. Second trench 5 is greater in depth than first trench 70. Second trench 5 has a depth of not less than 0.5 µm and not more than 1.5 µm, for example. Second trench 5 is substantially equal in width to first trench 70. Second trench 5 has a width of not less than 0.6 µm and not more than 2.5 µm, for example. Second trench 5 may be greater in width than first trench 70.

Next, a step of annealing the silicon carbide substrate (S70: FIG. 3) is performed. First, mask 64 is removed from first main surface 1 of silicon carbide substrate 100 (see FIG. 12). Then, silicon carbide substrate 100 is disposed in a case 80 made of silicon carbide (see FIG. 13). Case 80 has a containing portion 81 and a cover portion 82. Silicon carbide substrate 100 is disposed in containing portion 81. Cover portion 82 is disposed on containing portion 81. Silicon carbide substrate 100 is thus enclosed within case 80.

Silicon carbide substrate 100 is heated while being enclosed within case 80. Since silicon carbide substrate 100 is disposed in case 80 made of silicon carbide, silicon carbide substrate 100 is heated in a silicon carbide atmosphere. Silicon carbide is thus maintained in a thermal equilibrium state. In the silicon carbide atmosphere, silicon carbide substrate 100 is annealed at not less than 1400° C. and not more than 1900° C. Preferably, silicon carbide substrate 100 is annealed at not less than 1500° C. and not more than 1800° C. An annealing temperature for silicon carbide substrate 100 is 1700° C., for example. An annealing time is 10 minutes, for example.

Thermal etching of second trench 5 and activation of the ion-implanted impurities are simultaneously performed as set forth above. The thermal etching removes a plasma damaged layer at each of second side surface 3 and second bottom surface 4 of second trench 5, while rounding each corner formed by second side surface 3 and second bottom surface 4. As a result of the rounded corner, concentration of electric field at a boundary portion between second side surface 3 and second bottom surface 4 can be suppressed.

Next, a step of forming a gate insulating film (S80: FIG. 3) is performed. Specifically, gate insulating film 6 in contact with first main surface 1, second side surface 3 and second bottom surface 4 is formed (see FIG. 14). Gate insulating film 6 is a deposited oxide film, for example. Gate insulating film 6 is in contact with third region 13, fourth impurity region 40, base region 20, and source region 30, at second side surface 3. Gate insulating film 6 is in contact with fourth impurity region 40 at second bottom surface 4. Gate insulating film 6 is in contact with source region 30 at first main surface 1. Gate insulating film 6 has a thickness of not less than 40 nm and not more than 150 nm, for example.

Next, a NO annealing step is performed. Specifically, silicon carbide substrate 100 having gate insulating film 6 formed on first main surface 1 is subjected to heat treatment at a temperature of not less than 1100° C. and not more than 1300° C., for example, in an atmosphere containing nitrogen. Examples of the gas containing nitrogen include nitrogen monoxide diluted with nitrogen by 10%. Silicon carbide substrate 100 is annealed for not less than 30 minutes and not more than 360 minutes, for example, in the gas containing nitrogen.

Next, a step of forming a gate electrode (S90: FIG. 3) is performed. Specifically, gate electrode 7 is formed on gate insulating film 6 to fill a groove formed by gate insulating film 6. Gate electrode 7 is made of a material including polysilicon containing an impurity, for example. Then, interlayer insulating film 23 is formed to cover gate electrode 7. Interlayer insulating film 23 includes a NSG film and a PSG film, for example.

Next, a step of forming a source electrode (S100: FIG. 3) is performed. Specifically, interlayer insulating film 23 and gate insulating film 6 are removed from a region where source electrode 8 is to be formed, to expose each of source region 30 and contact region 42 at interlayer insulating film 23. Then, source electrode 8 is formed by sputtering, for example, to be in contact with both source region 30 and contact region 42 at first main surface 1. Source electrode 8 contains a Ni alloy, for example. Source electrode 8 may be made of a material containing TiAlSi. Then, silicon carbide substrate 100 having source electrode 8 is subjected to rapid thermal anneal (RTA) of not less than 900° C. and not more than 1100° C., for example, for about 2 minutes. At least a part of source electrode 8 thus reacts with silicon contained in silicon carbide substrate 100 and is silicided. Source electrode 8 in ohmic contact with source region 30 is thus formed. Preferably, source electrode 8 is in ohmic contact with each of source region 30 and contact region 42.

Next, source wire 21 is formed to be in contact with source electrode 8 and to cover interlayer insulating film 23. Source wire 21 is preferably made of a material containing Al, for example, a material containing AlSiCu. Then, protective film 22 is formed to cover source wire 21. Protective film 22 is made of a material including a nitride film and polyimide, for example.

Next, a step of forming a drain electrode (S110: FIG. 3) is performed. Specifically, drain electrode 9 made of NiSi, for example, is formed in contact with second main surface 2 of silicon carbide substrate 100. Drain electrode 9 may be made of TiAlSi, for example. Drain electrode 9 is preferably formed by sputtering, but may be formed by vapor deposition. After being formed, drain electrode 9 is heated by laser annealing, for example. At least a part of drain electrode 9 is thus silicided and in ohmic contact with silicon carbide single-crystal substrate 15. MOSFET 200 shown in FIG. 1 is manufactured in a manner described above.

Figure 15:
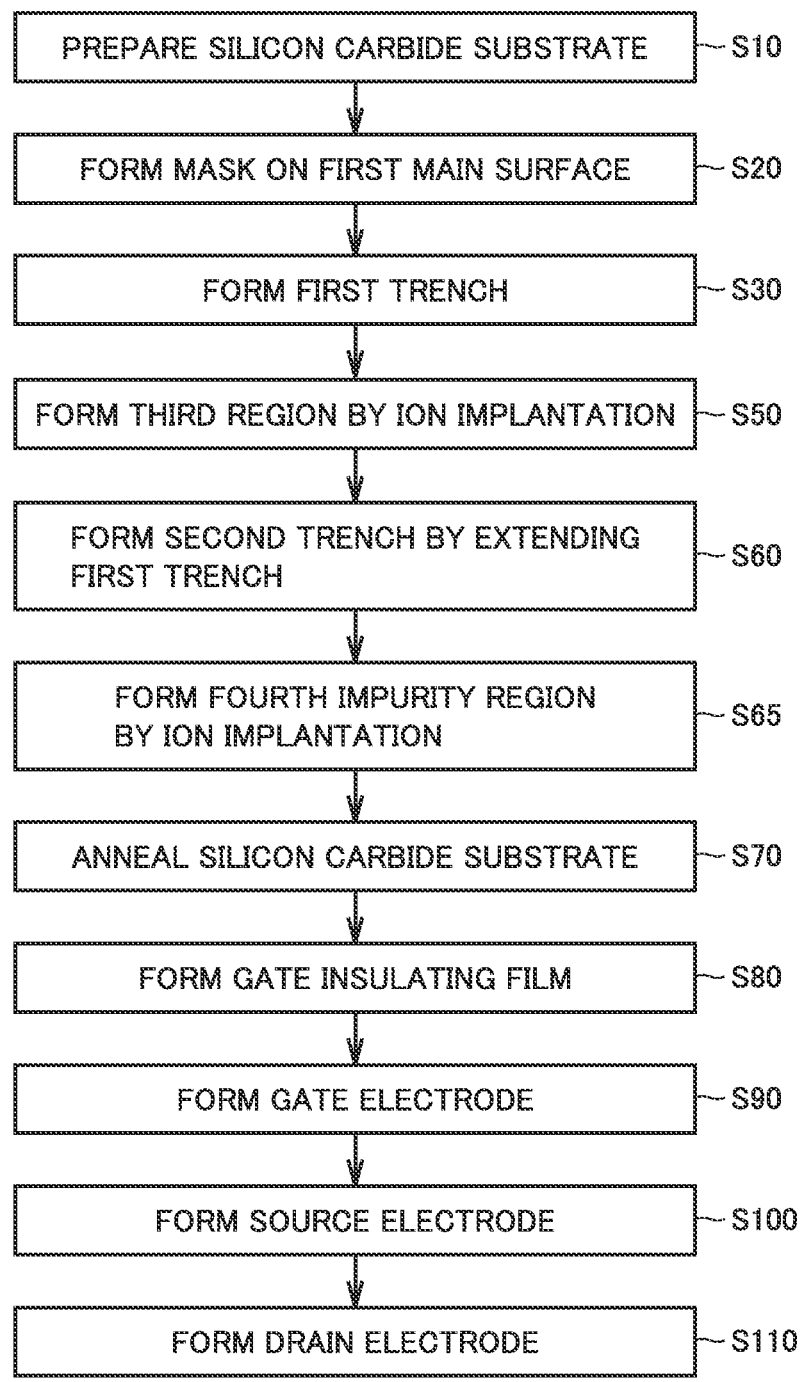
FIG. 15 is a flow diagram schematically showing a method of manufacturing a silicon carbide semiconductor device according to a variation of the first embodiment.

A method of manufacturing silicon carbide semiconductor device 200 according to a variation of the present embodiment is now described. FIG. 15 is a flowchart schematically showing the method of manufacturing silicon carbide semiconductor device 200 according to the variation of the present embodiment.

First, as shown in FIGS. 3 to 9, the step of preparing a silicon carbide substrate (S10: FIG. 15), the step of forming a mask on a first main surface (S20: FIG. 15), and the step of forming a first trench (S30: FIG. 15) are performed.

Figure 16:
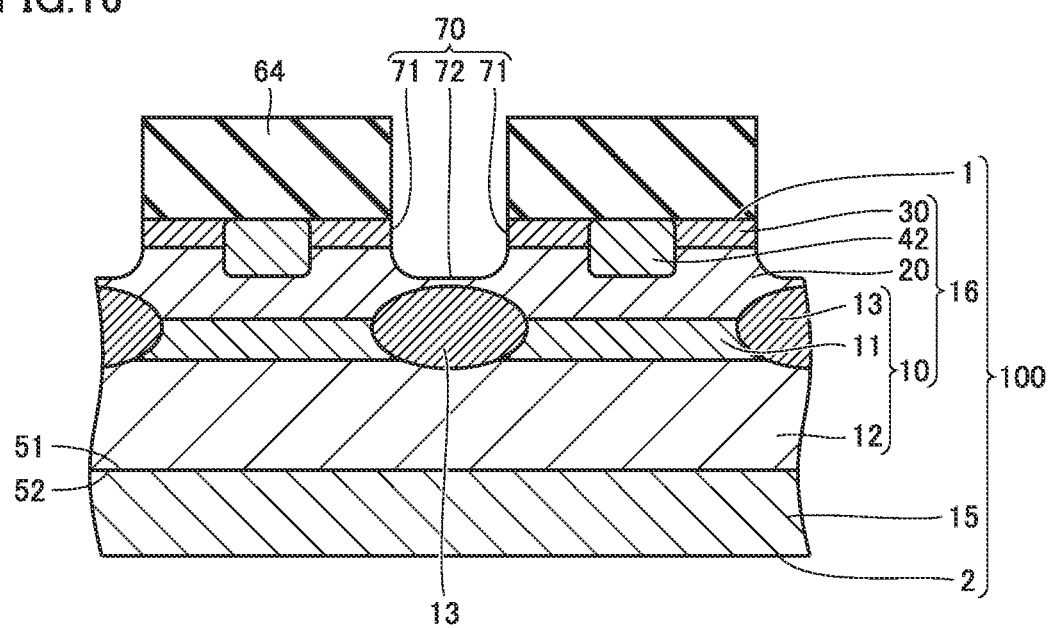
FIG. 16 is a schematic cross-sectional view showing a first step of the method of manufacturing the silicon carbide semiconductor device according to the variation of the first embodiment.

Next, the step of forming a third region by ion implantation (S50: FIG. 15) is performed. Specifically, N (nitrogen) ions are implanted into a part of first region 11 and a part of second impurity region 20, with mask 64 being provided on first main surface 1 (see FIG. 16). As shown in FIG. 16, N (nitrogen) ions may be implanted into a part of second region 12. Ion implantation energy is not less than 400 keV, for example. Third region 13 having n type is thus formed.

Third region 13 is in contact with each of first region 11, second region 12 and second impurity region 20, for example. In the direction parallel to first main surface 1, third region 13 is greater in width than first bottom surface 72 of first trench 70. Third region 13 spreads about 0.1 µm from each of paired first side surfaces 71 of first trench 70. A concentration of the n type impurity contained in third region 13 is not less than $2 \times 10^{16}$ cm$^{-3}$ and not more than $5 \times 10^{17}$ cm$^{-3}$, for example. Third region 13 has a thickness of not less than 0.3 μm and not more than 1 μm, for example. Third region 13 may be formed to be spaced apart from first bottom surface 72 of first trench 70. In this case, second impurity region 20 is provided between third region 13 and first bottom surface 72.

Next, the step of forming a second trench by extending the first trench (S60: FIG. 15) is performed. Specifically, using mask 64, third region 13 and second impurity region 20 are ECR plasma etched under an atmosphere of SF$_6$ and O$_2$. First trench 70 is thus extended to form second trench 5.

Figure 17:
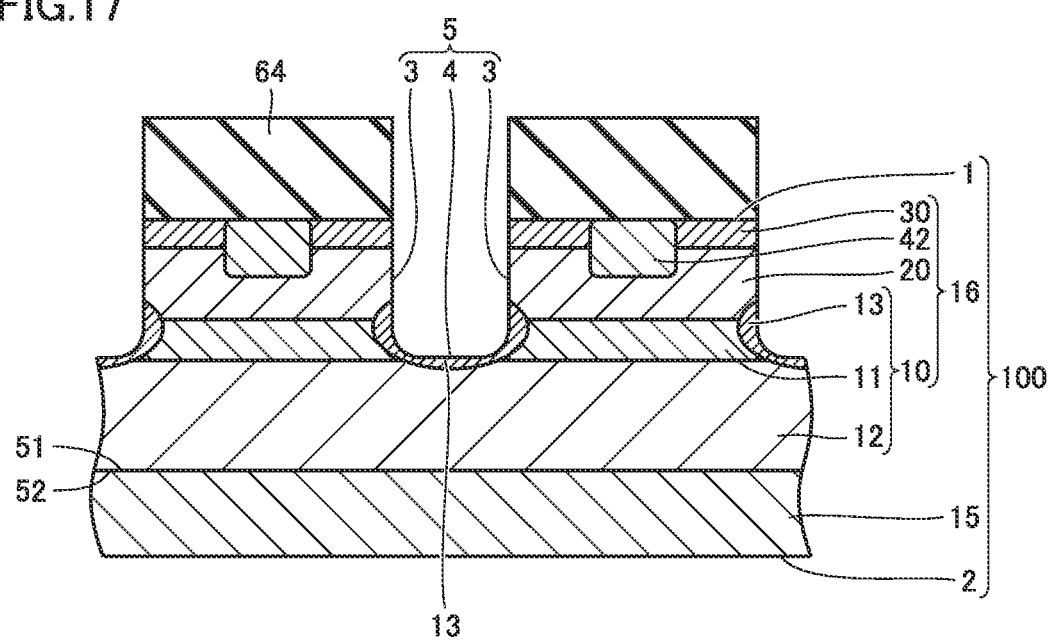
FIG. 17 is a schematic cross-sectional view showing a second step of the method of manufacturing the silicon carbide semiconductor device according to the variation of the first embodiment.

As shown in FIG. 17, second trench 5 has second side surface 3 and second bottom surface 4. Second side surface 3 is in contact with third region 13, second impurity region 20, and third impurity region 30. Second bottom surface 4 is in contact with third region 13. Second trench 5 is greater in depth than first trench 70. Second trench 5 has a depth of not less than 0.5 μm and not more than 1.5 μm, for example. Second trench 5 is substantially equal in width to first trench 70. Second trench 5 has a width of not less than 0.6 μm and not more than 2.5 μm, for example. Second trench 5 may be greater in width than first trench 70.

Next, a step of forming a fourth impurity region by ion implantation (S65: FIG. 15) is performed. Specifically, ions are implanted into first trench 70 using mask 64. In this step, mask 64 functions as an ion implantation mask. Specifically, Al (aluminum) ions are implanted into a part of third region 13 and a part of second region 12, with mask 64 being provided on first main surface 1. Ion implantation energy is not less than 700 keV, for example. Fourth impurity region 40 having p type is thus formed.

Fourth impurity region 40 is in contact with each of first region 11, second region 12, and third region 13. In the direction parallel to first main surface 1, fourth impurity region 40 is greater in width than second bottom surface 4 of second trench 5. Fourth impurity region 40 spreads about 0.2 μm from each of paired second side surfaces 3 of second trench 5. A concentration of the p type impurity contained in fourth impurity region 40 is not less than $1 \times 10^{18}$ cm$^{-3}$ and not more than $9 \times 10^{18}$ cm$^3$, for example. Fourth impurity region 40 has a thickness of not less than 0.5 μm and not more than 1.5 μm, for example.

Figure 12:
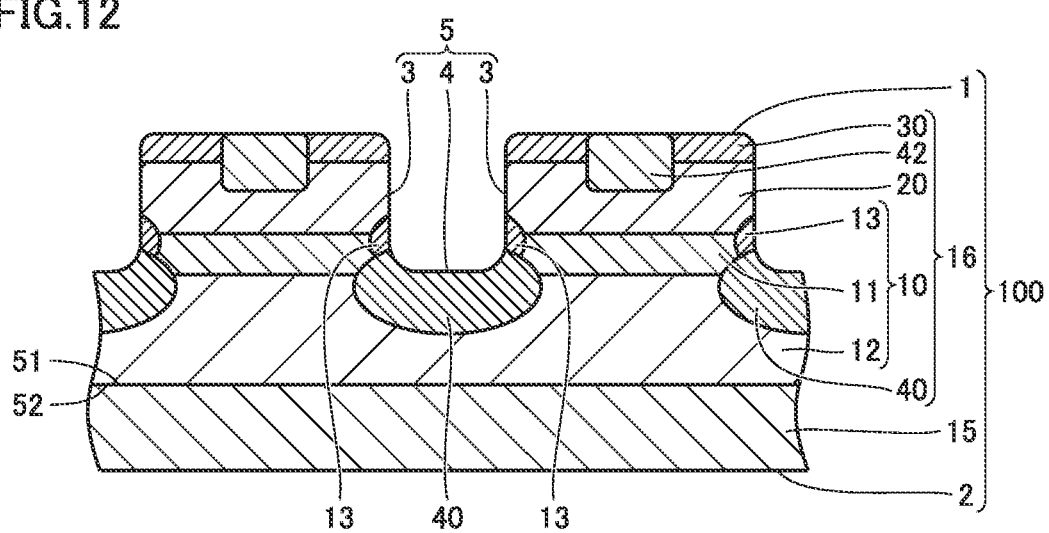
FIG. 12 is a schematic cross-sectional view showing a ninth step of the method of manufacturing the silicon carbide semiconductor device according to the first embodiment.
Figure 13:
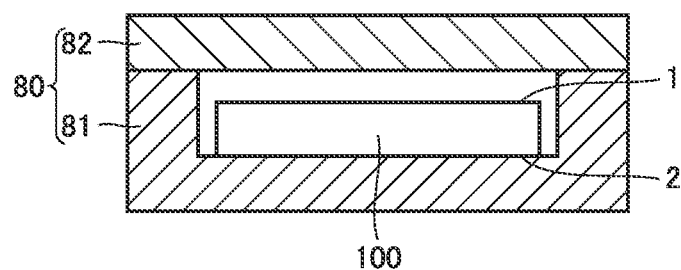
FIG. 13 is a schematic cross-sectional view showing a tenth step of the method of manufacturing the silicon carbide semiconductor device according to the first embodiment.
Figure 14:
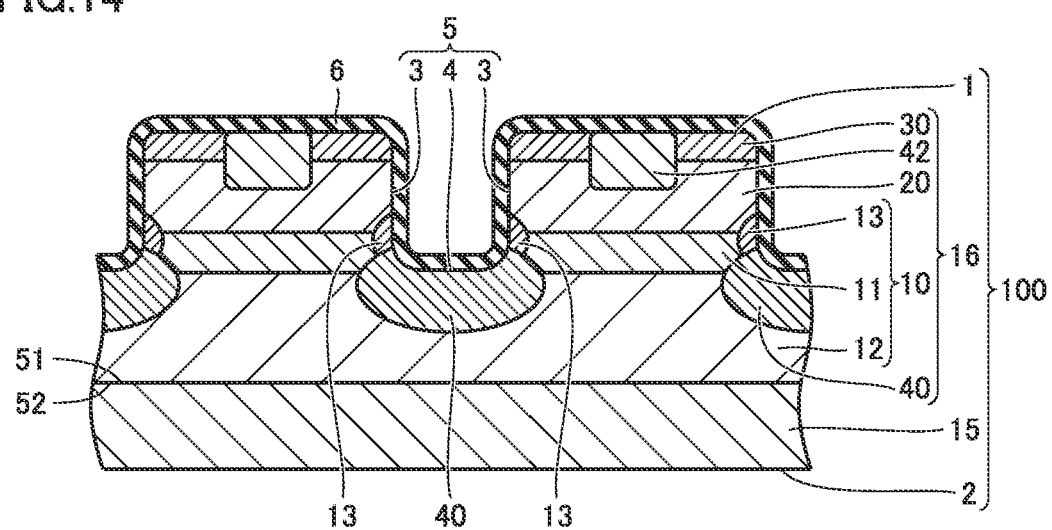
FIG. 14 is a schematic cross-sectional view showing an eleventh step of the method of manufacturing the silicon carbide semiconductor device according to the first embodiment.

Next, as shown in FIGS. 12 to 14, the step of annealing the silicon carbide substrate (S70: FIG. 15) and the step of forming a gate insulating film (S80: FIG. 15) are performed. Next, the step of forming a gate electrode (S90: FIG. 15), the step of forming a gate electrode (S100: FIG. 15), and the step of forming a drain electrode (S110: FIG. 15) are performed. MOSFET 200 shown in FIG. 1 is manufactured in a manner described above.

Second Embodiment

The configuration of silicon carbide semiconductor device 200 according to a second embodiment is now described. Silicon carbide semiconductor device 200 according to the second embodiment is primarily different in configuration from silicon carbide semiconductor device 200 according to the first embodiment in that fourth impurity region 40 is spaced apart from bottom surface 4 of trench 5, and is otherwise similar in configuration to silicon carbide semiconductor device 200 according to the first embodiment. The configuration different from silicon carbide semiconductor device 200 according to the first embodiment is mainly described below.

Figure 18:
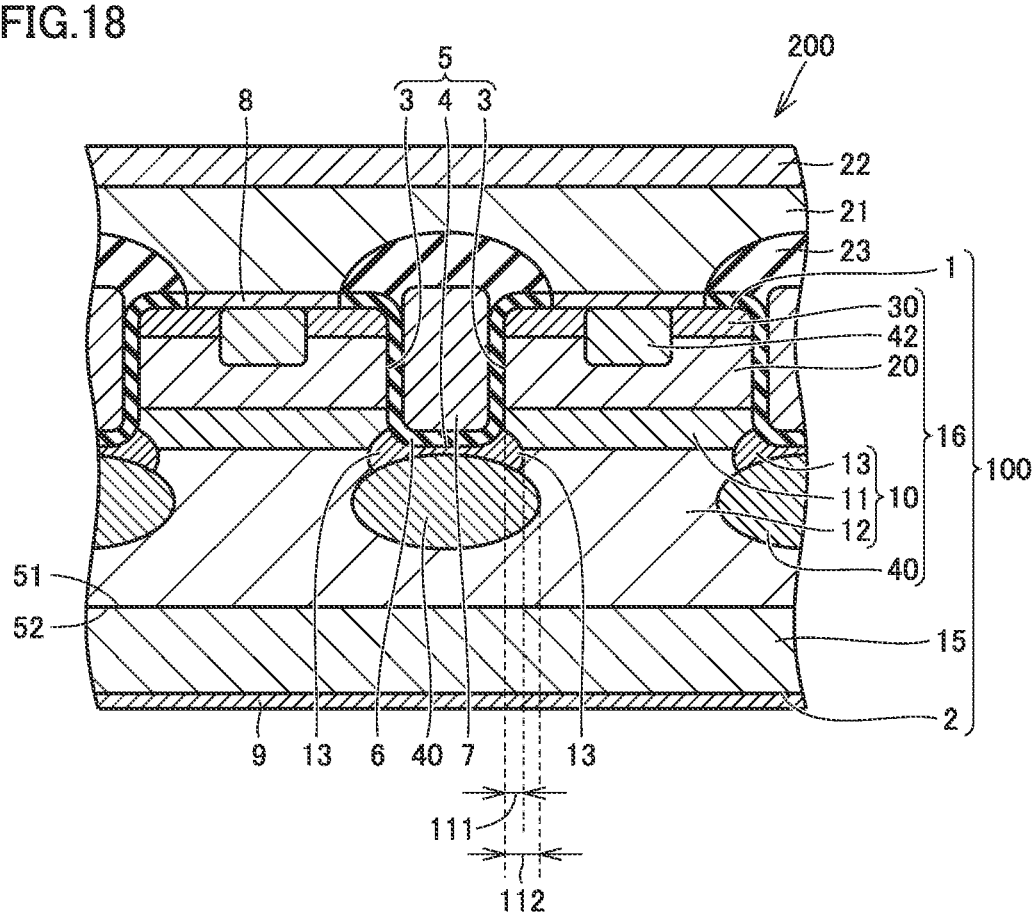
FIG. 18 is a schematic cross-sectional view showing the structure of a silicon carbide semiconductor device according to a second embodiment.

As shown in FIG. 18, in silicon carbide semiconductor device 200 according to the second embodiment, fourth impurity region 40 is spaced apart from bottom surface 4 of trench 5. Third region 13 is provided between bottom surface 4 and fourth impurity region 40. Third region 13 is in contact with each of bottom surface 4 and fourth impurity region 40. Side surface 3 of trench 5 is in contact with third region 13, second impurity region 20, and third impurity region 30. First region 11 may be in contact with side surface 3. Second region 12 is spaced apart from side surface 3. Third region 13 is in contact with each of first region 11 and second region 12.

Bottom surface 4 of trench 5 is in contact with third region 13. Third region 13 is provided to face the entire bottom surface 4, for example. In the direction parallel to first main surface 1, third region 13 is greater in width than bottom surface 4. In the direction parallel to first main surface 1, the distance from side surface 3 to the end of third region 13 (first distance) is shorter than the distance from side surface 3 to the end of fourth impurity region 40 (second distance). Stated from another perspective, in the direction parallel to first main surface 1, fourth impurity region 40 is greater in width than third region 13.

As shown in FIG. 18, in the direction perpendicular to second main surface 2, third region 13 at the center of bottom surface 4 may be smaller in thickness than third region 13 at the boundary between bottom surface 4 and side surface 3. In the direction perpendicular to second main surface 2, fourth impurity region 40 at the center of bottom surface 4 may be greater in thickness than fourth impurity region 40 at the boundary between bottom surface 4 and side surface 3.

Although silicon carbide semiconductor device 200 according to the present disclosure has been described above with reference to a MOSFET having trench 5 as an example, silicon carbide semiconductor device 200 according to the present disclosure is not limited thereto. Silicon carbide semiconductor device 200 according to the present disclosure may be, for example, an insulated gate bipolar transistor (IGBT). Although n type and p type have been described above as the first conductivity type and the second conductivity type, respectively, p type may be the first conductivity type and n type may be the second conductivity type. The concentration of a p type impurity and the concentration of an n type impurity in each impurity region described above can be measured, for example, with a scanning capacitance microscope (SCM) or secondary ion mass spectrometry (SIMS).

Functions and effects of silicon carbide semiconductor device 200 and the method of manufacturing the same according to the above embodiment will now be described.

According to silicon carbide semiconductor device 200 according to the above embodiment, fourth impurity region 40 having p type is provided between second main surface 2 and bottom surface 4 of trench 5. Thus, breakdown of gate insulating film 6 due to application of high electric field to gate insulating film 6 in the vicinity of bottom surface 4 can be suppressed. As a result, a high breakdown voltage of silicon carbide semiconductor device 200 can be maintained. First impurity region 10 has first region 11 being in contact with second impurity region 20 and having the first impurity concentration, second region 12 provided between first region 11 and second main surface 2 and having the second impurity concentration lower than the first impurity concentration, and third region 13 being continuous to first region 11 and having the third impurity concentration higher than the first impurity concentration. By providing third region 13 higher in impurity concentration than first region 11, narrowing of a current in the vicinity of the channel outlet can be suppressed. Thus, the on resistance of silicon carbide semiconductor device 200 can be reduced.

According to silicon carbide semiconductor device 200 according to the above embodiment, fourth impurity region 40 may be in contact with bottom surface 4. Thus, application of high electric field to gate insulating film 6 in the vicinity of bottom surface 4 can be further suppressed. As a result, a higher breakdown voltage of silicon carbide semiconductor device 200 can be maintained.

Further, according to silicon carbide semiconductor device 200 according to the above embodiment, in the direction parallel to first main surface 1, the distance from side surface 3 to the end of third region 13 may be shorter than the distance from side surface 3 to the end of fourth impurity region 40. In this case, when third region 13 is seen from second region 12, third region 13 is blocked by fourth impurity region 40. Thus, application of high electric field to gate insulating film 6 in the vicinity of third region 13 can be suppressed. As a result, a high breakdown voltage of silicon carbide semiconductor device 200 can be maintained.

According to the method of manufacturing silicon carbide semiconductor device 200 according to the present disclosure, third impurity region 30 and second impurity region 20 are etched using mask 64, to form first trench 70 in first main surface 1. The ions are implanted into first trench 70 using mask 64, to form third region 13 being in contact with first impurity region 10 and having the first conductivity type. Third region 13 and second impurity region 20 are etched using mask 64, to extend first trench 70 to form second trench 5. The ions are implanted into second trench 5 using mask 64, to form fourth impurity region 40 being in contact with first impurity region 10 and having the second conductivity type. By performing the etching and ion implantation (self-alignment) using the same mask 64 as described above, the occurrence of misalignment can be suppressed. Thus, third region 13 and fourth impurity region 40 can be formed with a high degree of accuracy. The number of steps can also be reduced to cut the process cost.

According to the method of manufacturing silicon carbide semiconductor device 200 according to the present disclosure, third impurity region 30 and second impurity region 20 are etched using mask 64, to form first trench 70 in first main surface 1. The ions are implanted into first trench 70 using mask 64, to form third region 13 being in contact with first impurity region 10 and having the first conductivity type. Third region 13 and second impurity region 20 are etched using mask 64, to extend first trench 70 to form second trench 5. The ions are implanted into second trench 5 using mask 64, to form fourth impurity region 40 being in contact with first impurity region 10 and having the second conductivity type. By performing the etching and ion implantation (self-alignment) using the same mask 64 as described above, the occurrence of misalignment can be suppressed. Thus, third region 13 and fourth impurity region 40 can be formed with a high degree of accuracy. The number of steps can also be reduced to cut the process cost.

According to the method of manufacturing silicon carbide semiconductor device 200 according to the present disclosure, after forming second trench 5, silicon carbide substrate 100 may be annealed at not less than 1400° C. and not more than 1900° C. in the silicon carbide atmosphere. Thus, thermal etching of second trench 5 and activation of the ion-implanted impurities are simultaneously performed. Accordingly, as compared to an example where thermal etching of second trench 5 and activation of the ion-implanted impurities are performed in different steps, the number of steps can be reduced. As a result, the process cost can be cut further.

EXAMPLE

A characteristic on resistance and a breakdown voltage of a MOSFET were calculated through simulation while first distance 111 (the distance from side surface 3 of trench 5 to the end of third region 13 in a direction parallel to second main surface 2) in the MOSFET according to the first embodiment (see FIG. 1) was varied. Results of the calculation are described. The characteristic on resistance and the breakdown voltage of the MOSFET were calculated while a value of first distance 111 was varied from 0 μm to 0.7 μm. An n type impurity concentration in first region 11 was set to $1\times10^{17}$ cm$^{-3}$. An n type impurity concentration in second region 12 was set to $8\times10^{15}$ cm$^{-3}$. An n type impurity concentration in third region 13 was set to $2\times10^{17}$ cm$^{-3}$. A p type impurity concentration in fourth impurity region 40 was set to $3\times10^{18}$ cm$^{-3}$.

Figure 19:
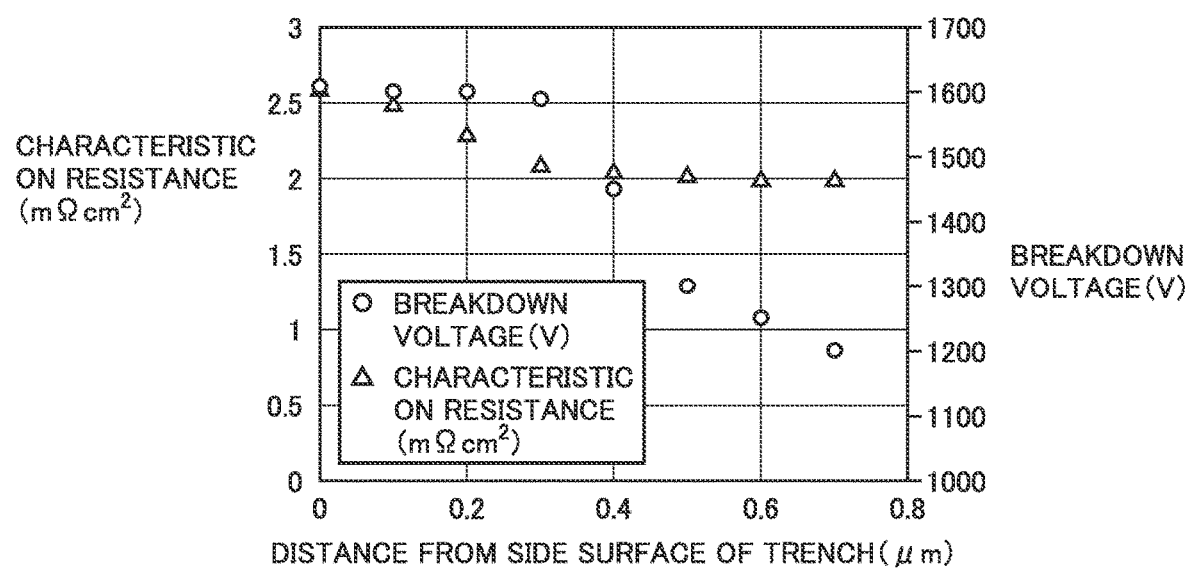
FIG. 19 shows simulation data illustrating relation between a characteristic on resistance and a distance from a side surface of a trench, and relation between a breakdown voltage and the distance from the side surface of the trench.

Relation between the distance from side surface 3 of trench 5 (first distance 111) and the characteristic on resistance, and relation between the distance from side surface 3 of trench 5 (first distance 111) and the breakdown voltage are described with reference to FIG. 19. In the figure, the horizontal axis represents the distance (μm) from side surface 3 of trench 5, the left vertical axis represents the characteristic on resistance (mΩcm$^2$) of the MOSFET, and the right vertical axis represents the breakdown voltage (V) of the MOSFET. In the figure, a white circle represents a value of the breakdown voltage, and a white triangle represents a value of the characteristic on resistance. A breakdown voltage specification was 1200 V.

When the distance from side surface 3 of trench 5 is in the range from not less than 0 μm to less than 0.4 μm, the characteristic on resistance decreases gradually. When the distance from side surface 3 of trench 5 reaches 0.4 μm or more, however, the characteristic on resistance is maintained at a substantially constant value. As for the breakdown voltage, the specification is satisfied over the entire range. When the distance from side surface 3 of trench 5 is in the range from not less than 0 μm to not more than 0.3 μm, the breakdown voltage exhibits a particularly high value. When the distance from side surface 3 of trench 5 exceeds 0.3 μm, however, the breakdown voltage decreases gradually. From the results above, it was confirmed that a MOSFET including third region 13 can reduce the characteristic on resistance while maintaining a high breakdown voltage, as compared to a MOSFET not including third region 13.

It should be understood that the embodiments and example disclosed herein are illustrative and non-restrictive in every respect. The scope of the present invention is defined by the terms of the claims rather than the description above, and is intended to include any modifications within the scope and meaning equivalent to the terms of the claims.

REFERENCE SIGNS LIST 1 first main surface; 2 second main surface; 3 side surface (second side surface); 4 bottom surface (second bottom surface); 5 second trench (trench); 6 gate insulating film; 7 gate electrode; 8 source electrode; 9 drain electrode; 10 first impurity region; 11 first region; 12 second region; 13 third region; 15 silicon carbide single-crystal substrate; 16 silicon carbide epitaxial layer; 20 base region (second impurity region); 21 source wire; 22 protective film; 23 interlayer insulating film; 30 source region (third impurity region); 40 fourth impurity region; 42 contact region; 51 third main surface; 60 ion implantation through-mask; 61 first portion; 62 second portion; 63 oxide film mask; 64 mask; 70 first trench; 71 first side surface; 72 first bottom surface; 80 case; 81 containing portion; 82 cover portion; 100 silicon carbide substrate; 101 first direction; 102 second direction; 111 first distance; 112 second distance; 200 silicon carbide semiconductor device (MOSFET).

The invention claimed is:

1. A silicon carbide semiconductor device comprising a silicon carbide substrate having a first main surface and a second main surface opposite to the first main surface,
the first main surface being provided with a trench having a side surface and a bottom surface continuous to the side surface,
the silicon carbide substrate including
a first impurity region located between the first main surface and the second main surface and having a first conductivity type,
a second impurity region located between the first main surface and the first impurity region, provided on the first impurity region, and having a second conductivity type different from the first conductivity type,
a third impurity region located between the first main surface and the second impurity region, provided on the second impurity region so as to be separated from the first impurity region, and having the first conductivity type, and
a fourth impurity region provided between the second main surface and the bottom surface and having the second conductivity type,
the first impurity region having
a first region being in contact with the second impurity region and having a first impurity concentration,
a second region being continuous to the first region, provided between the first region and the second main surface, and having a second impurity concentration lower than the first impurity concentration, and
a third region being continuous to the first region and having a third impurity concentration higher than the first impurity concentration,
the side surface being in contact with the third region, the second impurity region, and the third impurity region,
the fourth impurity region is in contact with the bottom surface, and
in a direction parallel to the first main surface, a distance from the side surface to an end of the third region is shorter than a distance from the side surface to an end of the fourth impurity region.

2. A silicon carbide semiconductor device comprising a silicon carbide substrate having a first main surface and a second main surface opposite to the first main surface,
the first main surface being provided with a trench having a side surface and a bottom surface continuous to the side surface,
the silicon carbide substrate including
a first impurity region located between the first main surface and the second main surface and having a first conductivity type,
a second impurity region located between the first main surface and the first impurity region, provided on the first impurity region, and having a second conductivity type different from the first conductivity type,
a third impurity region located between the first main surface and the second impurity region, provided on the second impurity region so as to be separated from the first impurity region, and having the first conductivity type, and
a fourth impurity region provided between the second main surface and the bottom surface and having the second conductivity type,
the first impurity region having
a first region being in contact with the second impurity region and having a first impurity concentration,
a second region being continuous to the first region, provided between the first region and the second main surface, and having a second impurity concentration lower than the first impurity concentration, and
a third region being continuous to the first region and having a third impurity concentration higher than the first impurity concentration,
the side surface being in contact with the third region, the second impurity region, and the third impurity region,
the fourth impurity region is spaced apart from the bottom surface, and
the third region is provided between the bottom surface and the fourth impurity region, and is in contact with each of the bottom surface and the fourth impurity region.

3. The silicon carbide semiconductor device according to claim 2, wherein
the third region is in contact with the second region, and
in a direction parallel to the first main surface, a distance from the side surface to an end of the third region is shorter than a distance from the side surface to an end of the fourth impurity region.

4. A method of manufacturing a silicon carbide semiconductor device, the method comprising:
preparing a silicon carbide substrate having a first main surface and a second main surface opposite to the first main surface,
the silicon carbide substrate including
a first impurity region located between the first main surface and the second main surface and having a first conductivity type,
a second impurity region located between the first main surface and the first impurity region, provided on the first impurity region, and having a second conductivity type different from the first conductivity type, and
a third impurity region located between the first main surface and the second impurity region, provided on the second impurity region so as to be separated from the first impurity region, being in contact with the first main surface, and having the first conductivity type,
the first impurity region having a first region in contact with the second impurity region, and a second region being continuous to the first region and located opposite to the second impurity region with respect to the first region;
forming a mask on the first main surface;
etching the third impurity region and the second impurity region using the mask, to form a first trench in the first main surface;

implanting ions into the first trench using the mask, to form a fourth impurity region being in contact with the first impurity region and having the second conductivity type;

implanting ions into the first trench using the mask, to form a third region being in contact with the first impurity region and having the first conductivity type; and etching the third region, the second impurity region and the fourth impurity region using the mask, to extend the first trench to form a second trench, a side surface of the second trench being in contact with the third region, the second impurity region, and the third impurity region.

5. The method of manufacturing a silicon carbide semiconductor device according to claim 4, further comprising, after forming the second trench, annealing the silicon carbide substrate at not less than 1400° C. and not more than 1900° C. in a silicon carbide atmosphere.

6. A method of manufacturing a silicon carbide semiconductor device, the method comprising:

preparing a silicon carbide substrate having a first main surface and a second main surface opposite to the first main surface, the silicon carbide substrate including a first impurity region located between the first main surface and the second main surface and having a first conductivity type, a second impurity region located between the first main surface and the first impurity region, provided on the first impurity region, and having a second conductivity type different from the first conductivity type, and a third impurity region located between the first main surface and the second impurity region, provided on the second impurity region so as to be separated from the first impurity region, being in contact with the first main surface, and having the first conductivity type, the first impurity region having a first region in contact with the second impurity region, and a second region being continuous to the first region and located opposite to the second impurity region with respect to the first region;

forming a mask on the first main surface;

etching the third impurity region and the second impurity region using the mask, to form a first trench in the first main surface;

implanting ions into the first trench using the mask, to form a third region being in contact with the first impurity region and having the first conductivity type;

etching the third region and the second impurity region using the mask, to extend the first trench to form a second trench; and implanting ions into the second trench using the mask, to form a fourth impurity region being in contact with the first impurity region and having the second conductivity type, a side surface of the second trench being in contact with the third region, the second impurity region, and the third impurity region.

* * * * *